(12) United States Patent
Song et al.

(10) Patent No.: US 6,442,057 B1
(45) Date of Patent: Aug. 27, 2002

(54) MEMORY MODULE FOR PREVENTING SKEW BETWEEN BUS LINES

(75) Inventors: Won-ki Song, Suwon; Tae-sung Jung, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/886,552

(22) Filed: Jun. 21, 2001

(30) Foreign Application Priority Data

Aug. 28, 2000 (KR) ........................................ 2000-50166

(51) Int. Cl.⁷ .............................. G11C 5/06; G11C 5/02
(52) U.S. Cl. .......................................... 365/63; 365/52
(58) Field of Search .............................. 365/51, 52, 63

(56) References Cited

U.S. PATENT DOCUMENTS

| 4,769,558 | A |   | 9/1988 | Bach ........................... 307/269 |
| 5,495,435 | A | * | 2/1996 | Sugahara ................ 365/230.03 |
| 6,034,878 | A | * | 3/2000 | Osaka et al. ................. 365/233 |

FOREIGN PATENT DOCUMENTS

| JP | 5101205 | 4/1993 | ........... G06F/15/78 |
| JP | 7261895 | 10/1995 | ............. G06F/3/00 |

* cited by examiner

*Primary Examiner*—Son Mai
(74) *Attorney, Agent, or Firm*—Mills & Onello LLP

(57) ABSTRACT

A memory module for preventing skew between bus lines is provided. The memory module includes a printed circuit board, memory chips, module tabs and bus lines. The memory chips are disposed on the printed circuit board, and the module tabs are disposed at one edge of the printed circuit board. The bus lines are connected to the module tabs, respectively, and are connected to the memory chips. Each of the bus lines is formed a closed circuit loop. Each of the bus lines is connected to the memory chips through a circuitous or roundabout path which includes first and second paths of, in general, different lengths. The first and second paths of the roundabout path branch from each other at a position on the closed circuit loop. Since each bus line on the memory module forms a closed loop, skew does not occur between control signals or output data, which are transmitted through the bus line.

3 Claims, 5 Drawing Sheets

MEMORY MODULE FOR PREVENTING SKEW BETWEEN BUS LINES

BACKGROUND OF THE INVENTION

1. Field of the Invention

The present invention relates to a memory module, and more particularly, to a memory module for preventing skew between bus lines within the memory module.

2. Description of the Related Art

A memory module is provided with a plurality of memory chips and is electrically connected to external devices such as a memory controller and a microprocessor through module tabs which are inserted into and contact sockets. The memory chips are connected to each other through bus lines disposed on the memory module. The bus lines are connected to external bus lines through the module tabs and carry commands transmitted to the memory chips or data output from the memory chips.

FIG. 1 is a diagram illustrating a conventional memory module. The conventional memory module includes first through eighth memory chips M1, M2, . . . , M8. The memory chips M1 through M8 are connected to one another through a bus line 10 which is connected to an external bus line through a module tab 20. The bus line has different line loads depending on physical distances to the memory chips M1 through M8. For example, the waveforms of signals through a bus line 1 connected to the first memory chip M1, through a bus line 5 connected to the fifth memory chip M5 and through a bus line 8 connected to the eighth memory chip M8, respectively, are as shown in FIG. 2.

In FIG. 2, the signal waveform on the bus line 5 connected to the fifth memory chip M5 appears first because the fifth memory chip M5 is nearest to the bus line 10. Next, the signal waveform on the bus line 8 connected to the eighth memory chip M8 appears with a little delay compared to the waveform on the bus line 5. The signal waveform on the bus line 1 connected to the first bus line M1 appears last. This is because the bus line 1 is longer than the bus line 5 and the bus line 8. Therefore, a time delay occurs between the waveform on the bus line and the waveform on the bus line 1. This time delay is referred to as skew and is represented by $t_{SKEW}$.

When a signal transmitted through the bus line 10 is related to an operating command, such skew $t_{SKEW}$ causes the memory chips to operate at different times.

As a result, this skew hinders the high speed data processing between the memory module and an external memory controller or an external microprocessor.

Accordingly, a method for reducing skew between bus lines within a memory module is desired.

SUMMARY OF THE INVENTION

To solve the above problems, it is an object of the present invention to provide a memory module for reducing skew between bus lines.

Accordingly, to achieve the above object of the invention, in one embodiment, there is provided a memory module including a printed circuit board, a plurality of memory chips disposed on the printed circuit board, module tabs disposed at one edge of the printed circuit board, and bus lines connected to the module tabs, respectively, and connected to the memory chips. A portion of the bus line that is connected to the memory chips is formed as a closed circuit loop.

In one embodiment, each of the bus lines is connected to the memory chips through a circuitous or roundabout path which includes first and second paths of, in general, different lengths. The first and second paths of the roundabout path branch from each other at a position on the closed circuit loop.

In another embodiment, there is provided a memory module including a printed circuit board, a plurality of memory chips disposed on the printed circuit board, module tabs disposed at one edge of the printed circuit board, buffers connected to the module tabs, respectively, and bus lines connected to the outputs of the buffers, respectively, and connected to the memory chips. A portion of each of the bus lines that is connected to the memory chips is formed as a closed circuit loop. The buffers increase the transition speed of signals passing through the bus lines.

According to the present invention, each bus line on the memory module forms a closed loop, so that skew does not occur between control signals or output data, which are transmitted through the bus line.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PRESENT INVENTION

Hereinafter, the present invention will be described in detail by describing preferred embodiments of the present invention with reference to the attached drawings.

Figure 1:
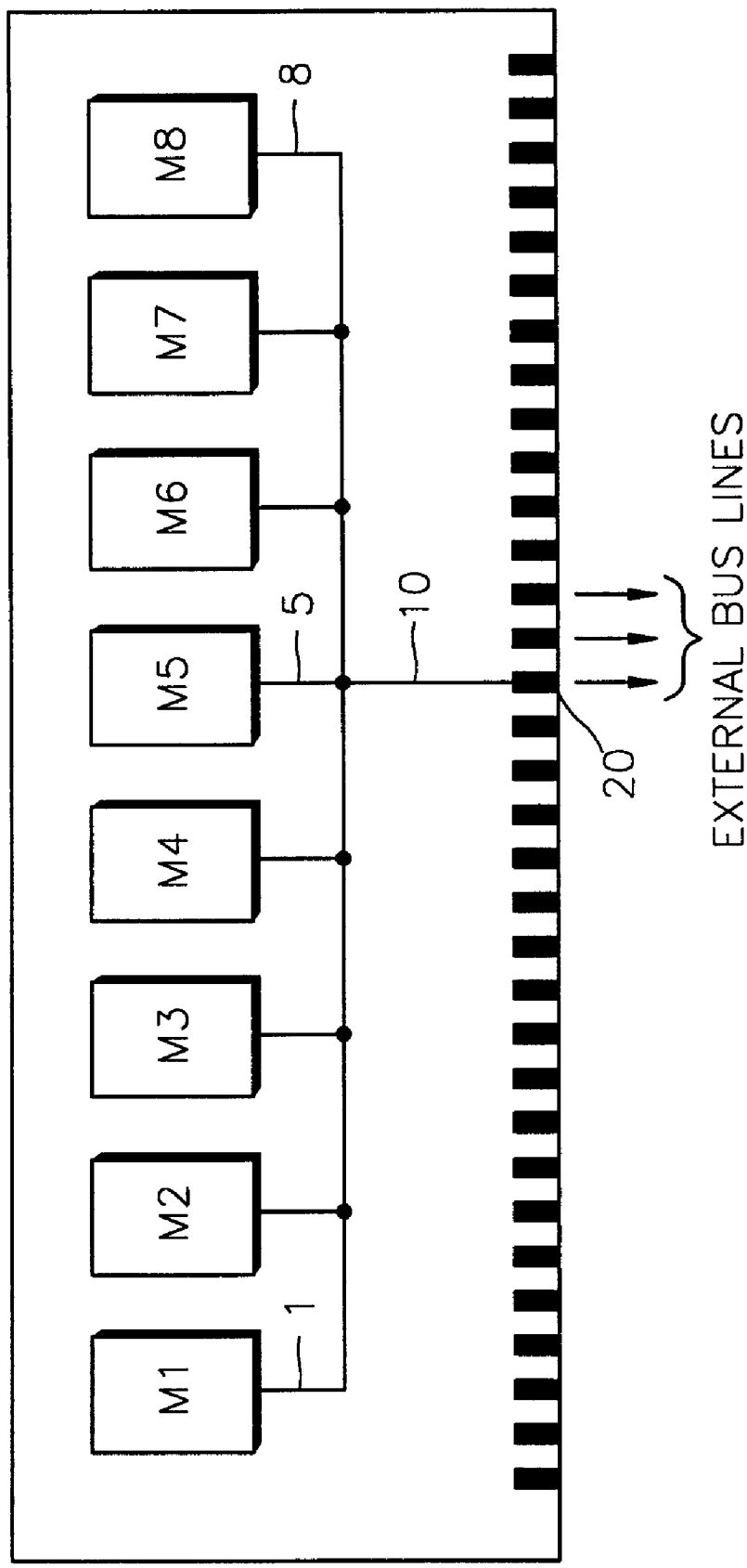
FIG. 1 is a diagram illustrating a conventional memory module.
Figure 2:
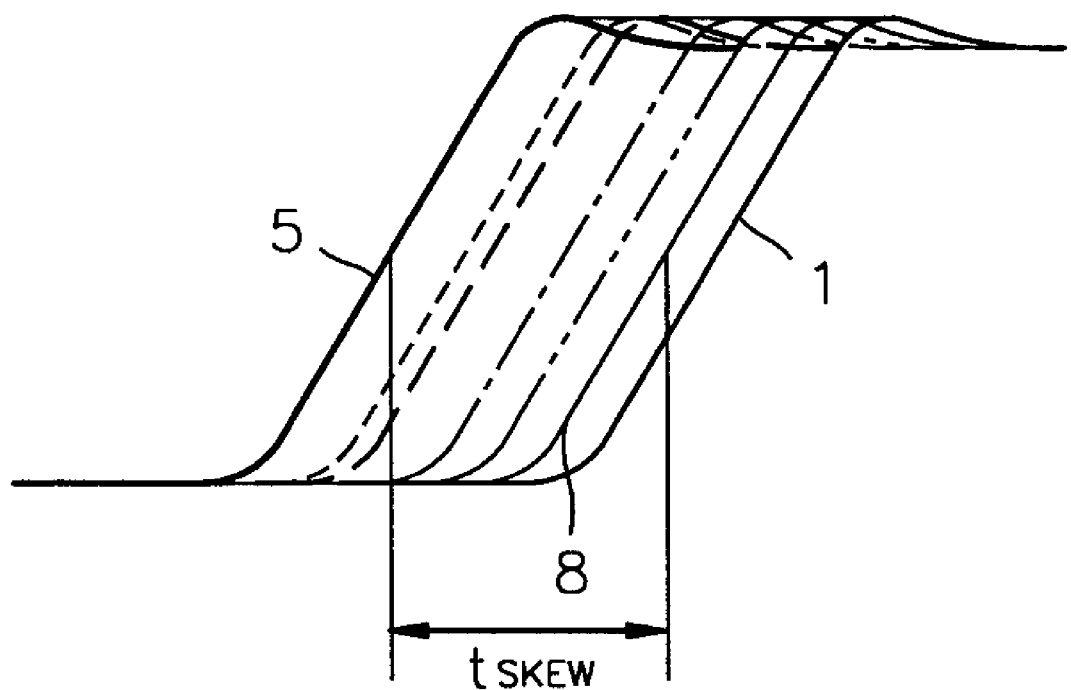
FIG. 2 is a diagram illustrating the waveforms of signals on the bus lines of FIG. 1.
Figure 3:
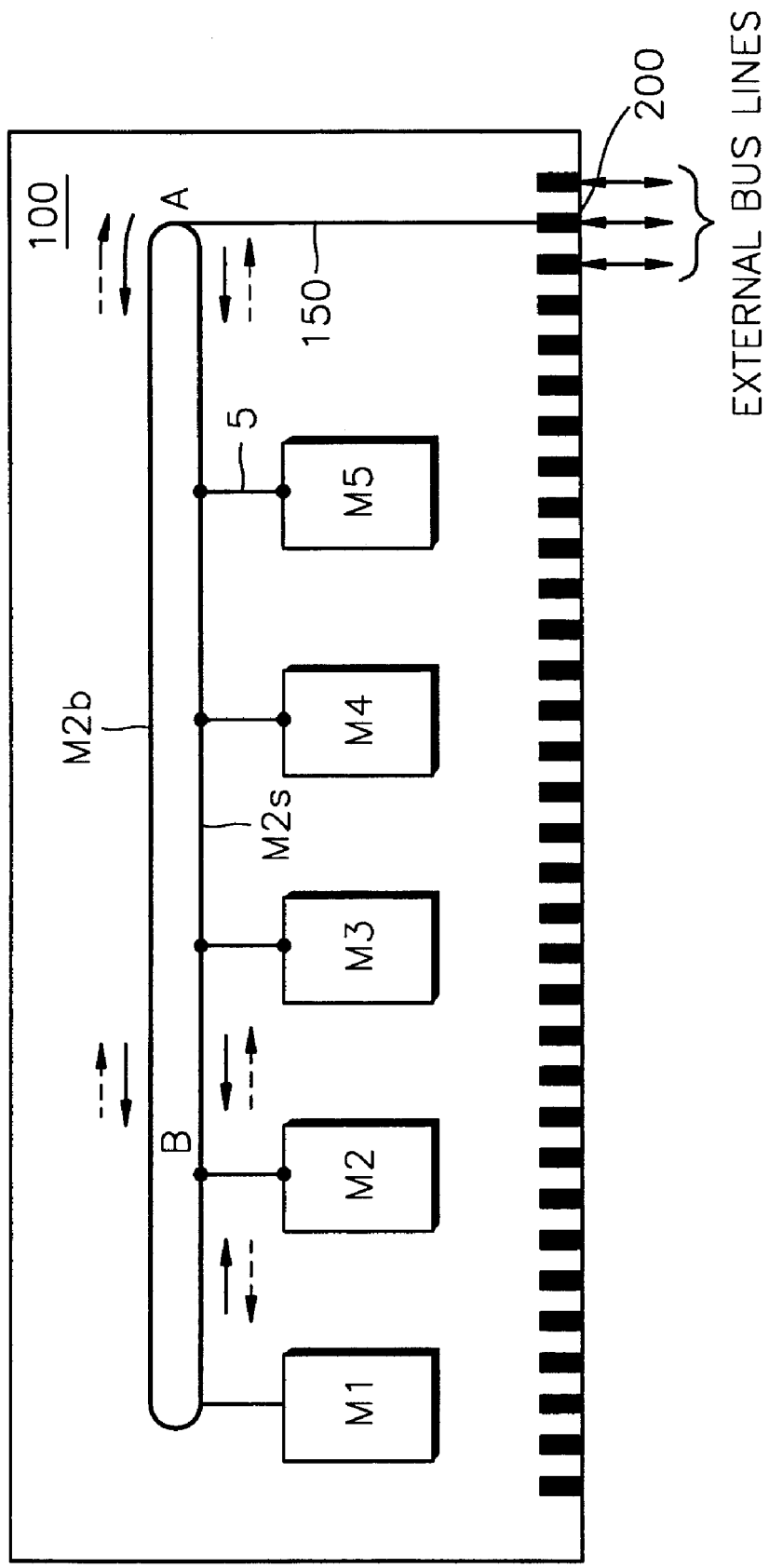
FIG. 3 is a diagram illustrating a memory module according to an embodiment of the present invention.

Referring to FIG. 3, which illustrates a memory module according to an embodiment of the present invention, the memory module includes a plurality of memory chips M1, M2, M3, M4 and M5 on a printed circuit board 100. Module tabs are disposed at one side edge of the printed circuit board 100. A bus line 150 is connected to the module tab 200. In addition, the bus line 150 is connected to the memory chips M1 through M5. The bus line 150 constructs a single closed circuit. Control signals related to commands provided from a memory controller or a microprocessor or data output from the memory chips M1 through M5 are transmitted through the bus line 150.

For example, a control signal for the second memory chip M2 and data output from the second memory chip M2 are transmitted through the bus line 150 which is a closed circuit. More specifically, a control signal for the second memory chip M2 reaches a position A through the module tab 200 and along the bus line 150. At the position A, the control signal is transmitted to the second memory chip M2 along the paths into which the bus line 150 branches at the position A. The paths are denoted by arrow headed solid lines (→). A circuitous or roundabout path from the position A to the second memory module M2 is referred to as line M2*b*, and a shorter path is referred to as a line M2*s*. The control signal charge-shares with the lines M2*s* and M2*b* and is transmitted to the second memory chip M2. The line M2*s* corresponds to a bus line through which a control signal is transmitted to the second memory chip M2 in a conventional memory module.

Figure 4:
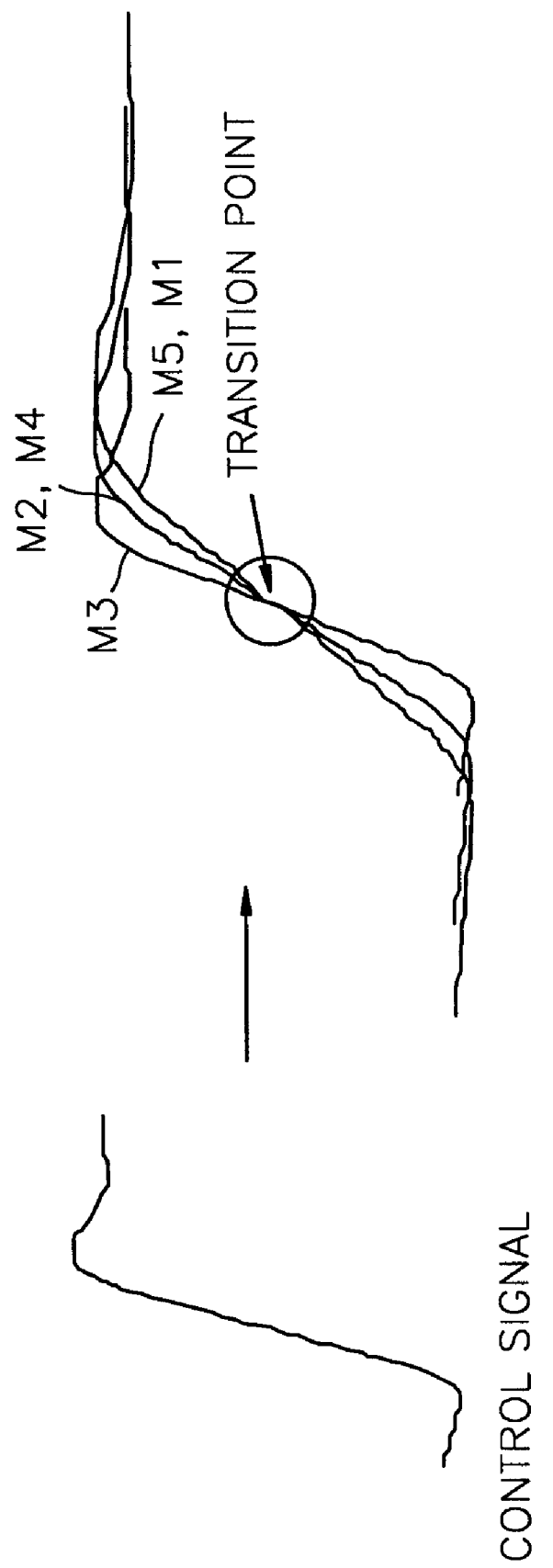
FIG. 4 is a diagram illustrating the waveforms of signals on the bus lines of FIG. 3.

Accordingly, the control signal reaches the second memory chip M2 in the present invention later than in a conventional memory module. However, control signals for the other memory chips M1, M3, M4 and M5 in addition to the second memory chips M2 are transmitted through the bus line which is a closed circuit, so the control signals reach the memory chips M1 through M5 at approximately the same time. In particular, the control signals input for the memory chips M1 through M5 nearly meet at one transition point, as shown in FIG. 4. Thus, skew does not occur between control signals transmitted to the memory chips M1 through M5.

Thereafter, the output data of the second memory chip M2 operated in response to the control signal is transmitted to the bus line 150 along paths, into which a line from the second memory chip M2 branches at a position B, and then transmitted to an external bus line through the module tab 200. The paths are denoted by arrow headed dotted lines (→). Here, the output data of each of the memory chips M1 through M5 is transmitted to the module tab 200 through the lines M2*s* and M2*b*. Therefore, the output data of the memory chips M1 through M5 reach a memory controller or a microprocessor, which is connected to the external bus line, nearly at the same time, so that skew does not occur between the output data.

Figure 5:
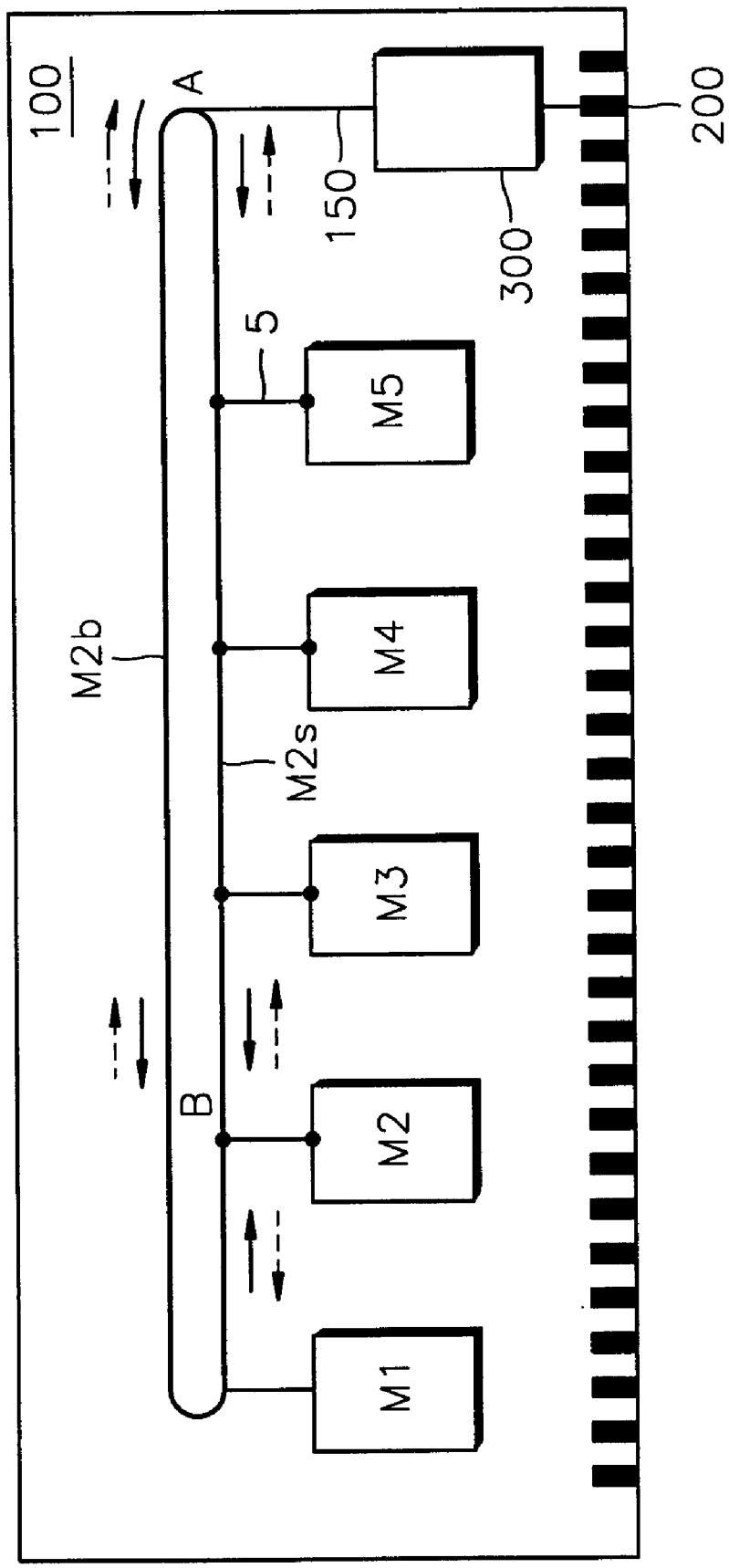
FIG. 5 is a diagram illustrating a memory module according to another embodiment of the present invention.

A memory module shown in FIG. 5 is almost the same as the memory module of FIG. 3, with the exception that a buffer 300 is further provided on the bus line 150. The buffer 300 is used for increasing the transition speed of a control signal on the bus line 150 or the transition speed of the output data of memory chips. Accordingly, a delay in signal transmission due to the load on the bus line 150 can be reduced. The buffer 300 can be realized as a typical inverter chain or a driver.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A memory module comprising:

a printed circuit board;

a plurality of memory chips disposed on the printed circuit board;

module tabs disposed at one edge of the printed circuit board; and a bus line connected to at least one of the module tabs and connected to the memory chips, a portion of the bus line connected to the memory chips being formed as a closed circuit loop; wherein the bus line is connected to each of the memory chips around the closed circuit loop through first and second paths, one of the first and second paths for each memory chip being longer than the other of the first and second paths for the memory chip, the first and second paths branching from each other at a branch position on the closed circuit loop.

2. A memory module comprising:

a printed circuit board;

a plurality of memory chips disposed on the printed circuit board;

module tabs disposed at one edge of the printed circuit board;

a buffer connected to at least one of the module tabs; and a bus line connected to the output of the at least one buffer and connected to the memory chips, a portion of the bus line connected to the memory chips being formed as a closed circuit loop; wherein the bus line is connected to each of the memory chips around the closed circuit loop through first and second paths, one of the first and second paths for each memory chip being longer than the other of the first and second paths for the chip, the first and second paths branching from each other at a branch position on the closed circuit loop.

3. The memory module of claim 2, wherein the buffer increases the transition speed of signals passing through the bus line.

\* \* \* \* \*